(12) United States Patent
Xie et al.

(10) Patent No.: US 11,069,684 B1
(45) Date of Patent: Jul. 20, 2021

(54) STACKED FIELD EFFECT TRANSISTORS WITH REDUCED COUPLING EFFECT

(71) Applicant: International Business Machines Corporation, Armonk, NY (US)

(72) Inventors: Ruilong Xie, Niskayuna, NY (US); Chun-Chen Yeh, Danbury, CT (US); Dechao Guo, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/809,205

(22) Filed: Mar. 4, 2020

(51) Int. Cl.
*H01L 21/02* (2006.01)
*H01L 21/3065* (2006.01)
(Continued)

(52) U.S. Cl.
CPC .... *H01L 27/0922* (2013.01); *H01L 21/02532* (2013.01); *H01L 21/02603* (2013.01); *H01L 21/3065* (2013.01); *H01L 21/764* (2013.01); *H01L 21/823807* (2013.01); *H01L 21/823814* (2013.01); *H01L 21/823828* (2013.01); *H01L 21/823871* (2013.01); *H01L 21/823878* (2013.01); *H01L 29/0653* (2013.01); *H01L 29/0673* (2013.01); *H01L 29/41733* (2013.01); *H01L 29/42392* (2013.01); *H01L 29/66545* (2013.01); *H01L 29/66553* (2013.01);
(Continued)

(58) Field of Classification Search
CPC .......... H01L 27/0922; H01L 21/02532; H01L 21/02603; H01L 21/3065; H01L 21/764; H01L 21/823807; H01L 21/823814; H01L 21/823828; H01L 21/823871; H01L 21/823878; H01L 29/0653; H01L 29/0673; H01L 29/41733; H01L 29/42392; H01L 29/66545; H01L 29/66553; H01L 29/66742; H01L 29/78618; H01L 29/78696
USPC ........................................................ 257/351
See application file for complete search history.

(56) References Cited

U.S. PATENT DOCUMENTS 9,905,643 B1   2/2018   Bergendahl et al.
10,026,652 B2  7/2018   Wang et al.
(Continued)

FOREIGN PATENT DOCUMENTS

JP   2018506861 A   3/2018

OTHER PUBLICATIONS

J. Ryckaert et al., "The Complimentary FET (CFET) for CMOS Sealing Beyond N3," IEEE Symposium on VLSI Technology, Jun. 18-22, 2018, pp. 141-142.

*Primary Examiner* — Tong-Ho Kim
(74) *Attorney, Agent, or Firm* — Jeffrey S LaBaw; Ryan, Mason & Lewis, LLP

(57) ABSTRACT

A semiconductor structure includes a first field-effect transistor disposed on a substrate. The first field-effect transistor includes a first metal gate, and a first source/drain region. A second field-effect transistor is vertically stacked above the first field-effect transistor. The second field-effect transistor includes a second metal gate, and a second source/drain region. The first metal gate and the second metal gate are vertically aligned and configured with an air gap disposed therebetween. The first source/drain region and the second source/drain region are vertically aligned and configured with another air gap disposed therebetween.

20 Claims, 13 Drawing Sheets

(51) Int. Cl.
  *H01L 21/764* (2006.01)
  *H01L 21/8238* (2006.01)
  *H01L 27/092* (2006.01)
  *H01L 29/06* (2006.01)
  *H01L 29/417* (2006.01)
  *H01L 29/423* (2006.01)
  *H01L 29/66* (2006.01)
  *H01L 29/786* (2006.01)

(52) U.S. Cl.
  CPC .. *H01L 29/66742* (2013.01); *H01L 29/78618* (2013.01); *H01L 29/78696* (2013.01)

(56) References Cited

U.S. PATENT DOCUMENTS

| | | |
|---|---|---|
| 10,192,819 B1 | 1/2019 | Chanemougame et al. |
| 10,192,867 B1 * | 1/2019 | Frougier ............ H01L 29/66545 |
| 10,243,043 B2 | 3/2019 | Mochizuki et al. |
| 10,256,158 B1 | 4/2019 | Frougier et al. |
| 2017/0309719 A1 | 10/2017 | Sun et al. |
| 2018/0301564 A1 | 10/2018 | Kwon et al. |
| 2019/0157414 A1 | 5/2019 | Ando et al. |

* cited by examiner

US 11,069,684 B1

STACKED FIELD EFFECT TRANSISTORS WITH REDUCED COUPLING EFFECT

BACKGROUND

A stacked field-effect transistor (SFET) includes a p-type field-effect transistor (PFET) vertically stacked on top of an n-type field-effect transistor (NFET) or vice versa. A SFET can utilize gate-all-around technology when stacking PFET and NFET wires on top of each other. Stacking can permit smaller scale devices, but can also be problematic when there are too many overlapping areas, such as fins and source/drain regions, causing unwanted high capacitance which could compromise device or circuit performance or functionality.

SUMMARY

Illustrative embodiments of the present application include techniques for use in semiconductor manufacture. In one illustrative embodiment, a method of forming a semiconductor structure comprises forming a first set of nanosheet layers and a second set of nanosheet layers on a substrate. Each of the first set of nanosheet layers and the second set of nanosheet layers comprises alternating silicon layers and silicon-germanium layers. The first set of nanosheet layers and the second set of nanosheet layers are separated by a first sacrificial isolation layer. The method further comprises forming a bottom source/drain region on the substrate and in contact with the first set of nanosheet layers. The method further comprises forming a second sacrificial isolation layer on at least the bottom source/drain region. The method further comprises forming a top source/drain region on at least a portion of the second sacrificial isolation layer. The method further comprises depositing an interlevel dielectric layer on the top source/drain region and the second sacrificial isolation layer. The method further comprises forming one or more trenches in the interlevel dielectric layer and exposing a top surface of the second sacrificial isolation layer. The method further comprises removing the second sacrificial isolation layer to form an air gap positioned between the bottom source/drain region and the top source/drain region.

In another illustrative embodiment, a method of forming a stacked integrated circuit structure comprises forming a plurality of stacked field-effect transistors comprising a first field-effect transistor and a second field-effect transistor on a substrate. The first field-effect transistor and the second field-effect transistor are separated by a first sacrificial isolation layer. The first field-effect transistor comprises a first metal gate and a first source/drain region. The second field-effect transistor comprises a second metal gate and a second source/drain region. The first metal gate and the second metal gate are vertically aligned. The first source/drain region and the second source/drain region are vertically aligned and separated by a second sacrificial isolation layer. The method further comprises forming an interlevel dielectric layer over the second source/drain region and on the second sacrificial isolation layer. The method further comprises forming one or more trenches in the interlevel dielectric layer and exposing a top surface of the second sacrificial isolation layer. The method further comprises removing the second sacrificial isolation layer to form an air gap positioned between the first source/drain region and the second source/drain region.

In another illustrative embodiment, a semiconductor structure comprises a first field-effect transistor disposed on a substrate. The first field-effect transistor comprises a first metal gate and a first source/drain region. The semiconductor structure further comprises a second field-effect transistor vertically stacked above the first field-effect transistor. The second field-effect transistor comprises a second metal gate and a second source/drain region. The first metal gate and the second metal gate are vertically aligned and configured with an air gap disposed therebetween. The first source/drain region and the second source/drain region are vertically aligned and configured with another air gap disposed therebetween.

Other embodiments will be described in the following detailed description of embodiments, which is to be read in conjunction with the accompanying figures.

DETAILED DESCRIPTION

Figure 1:
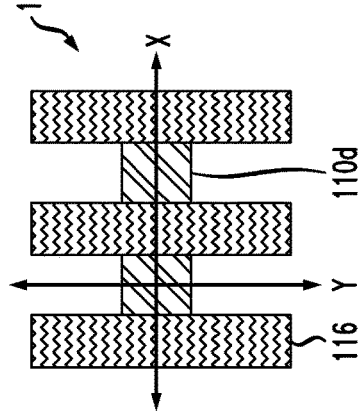
FIG. 1 depicts a plan view of a structure semiconductor indicating an X cross-section location and a Y cross-section location for each of the following figures.

This disclosure relates generally to integrated circuits (IC), and more particularly to stacked IC structures containing stacked FETs (SFETs) having a reduced coupling effect and a method of forming the same.

Exemplary embodiments of the invention will now be discussed in further detail with regard to stacked IC structures containing SFETs. SFETs have been considered as the next generation device. IC chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate-all-around technology. One example of a complex gate-all-around technology is a SFET where NFET and PFET nanowires/nanosheets are vertically stacked on top of each other. However, when directly putting an NFET source/drain (S/D) over a PFET S/D (or vice versa), and an NFET gate on top of a PFET gate, if capacitance coupling is too large, it will lead to transistor false turn-ons and/or read/write disturbs in static random-access memory to affect the stability. Thus, it is highly desirable to form a SFET having a reduced coupling.

Accordingly, illustrative embodiments provide a SFET device which includes an NFET (or PFET) channel device over a PFET (or NFET) channel device. When manufacturing such devices an airgap is formed between the NFET (or PFET) S/D region and the PFET (or NFET) S/D region. In addition, an airgap is also formed between the NFET (or PFET) S/D region and the PFET (or NFET) gate stack.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for fabricating stacked IC structures containing SFETs will be described below with reference to FIGS. 1-14. Note that the same reference numeral (100) is used to denote the semiconductor structure through the various intermediate fabrication stages illustrated in FIGS. 1 through 14. Note also that the semiconductor structure described herein can also be considered to be a semiconductor device and/or an integrated circuit, or some part thereof. For the purpose of clarity, some fabrication steps leading up to the production of the stacked IC structures containing SFETs as illustrated in FIGS. 1-14 are omitted. In other words, one or more well-known processing steps which are not illustrated but are well-known to those of ordinary skill in the art have not been included in the figures.

FIG. 1 illustrates a partial FET structure 100 (in plan view) indicating an X-cross section location and a Y cross-section location for identification purposes for each of the following figures. As shown in FIG. 1, partial FET structure 100 includes a hardmask 116 (not shown) and gate 114 which is flanked on top of layer 110d of nanosheet stack 106b and wraps around nanosheet stacks 106a and 106b (not shown). The X-cross section is an across-the-gate cross-section whereas the Y-cross section is an across-the-nanosheet stack cross-section that is perpendicular to the X-cross section and is between the gates.

Figure 2:
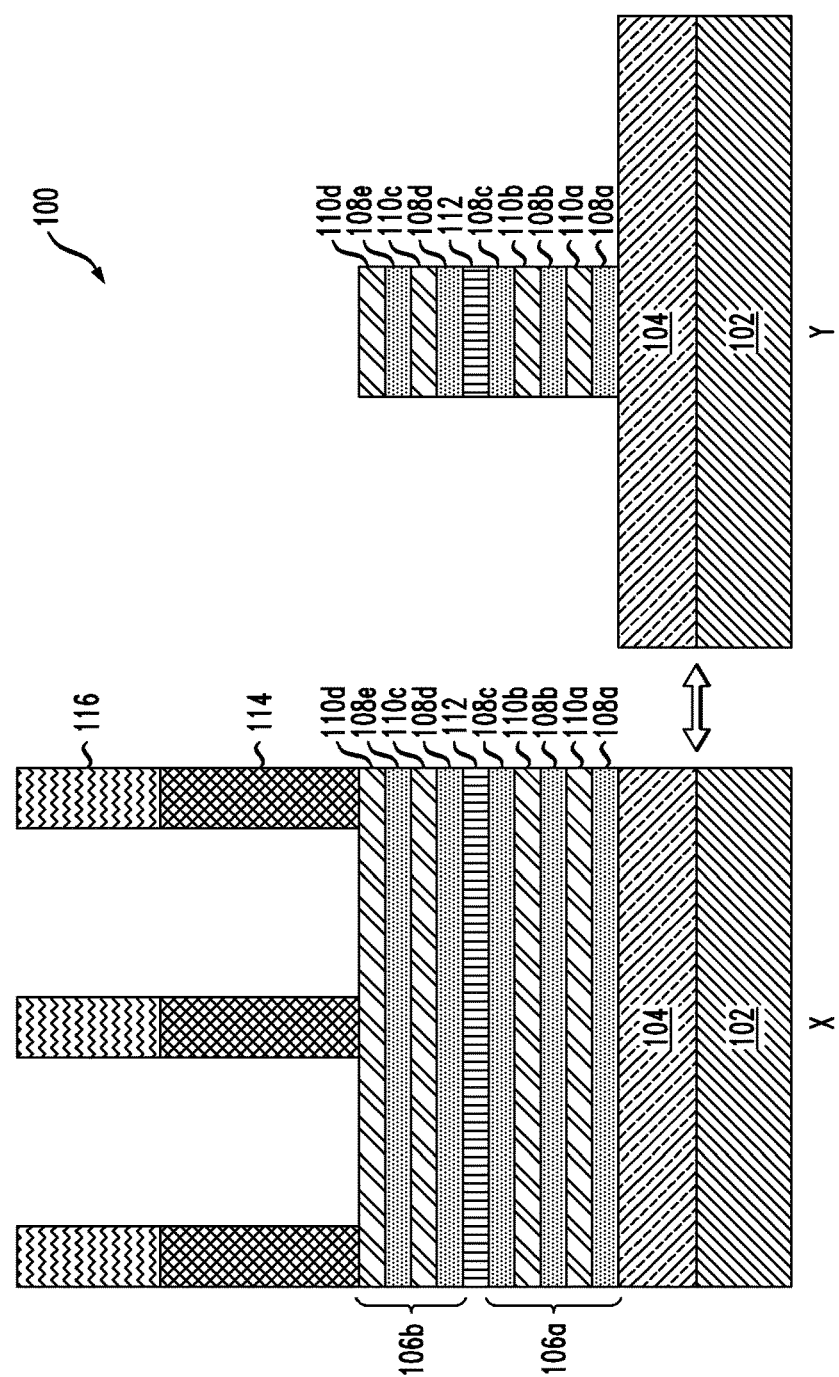
FIG. 2 is a cross sectional view of the semiconductor structure of FIG. 1 at a first-intermediate fabrication stage, according to an illustrative embodiment.

FIG. 2 illustrates a semiconductor structure 100 used for forming the semiconductor structures of the disclosure, at a first-intermediate stage. Semiconductor structure 100 is the result of epitaxially growing a plurality of nanosheet layers. For example, a first nanosheet stack 106a of alternating layers of silicon-germanium (SiGe) 108a, 108b and 108c, and silicon (Si) 110a and 110b can be formed on insulating layer 104, when present, or on substrate 102. Next, a layer of SiGe 112, which is different than the SiGe layer 108 is disposed on a top surface of first nanosheet stack 106a. A second nanosheet stack 106b of alternating layers of SiGe 108d and 108e and Si 110c and 110d is disposed on SIGe 112. However, different variations from that depicted in FIG. 2 can be used for the stacking of the Si and SiGe layers. The terms "epitaxial growth" and "epitaxially forming and/or growing" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

First nanosheet stack 106a includes a bottom-most layer of SiGe 108a and a top-most layer of SiGe 108c. First nanosheet stack 106a is depicted with five layers (three SiGe layers and two Si layers), however any number and combination of layers can be used so long as the layers alternate between SiGe and Si.

SiGe layer 112 is disposed between the uppermost layer 108c of first nanosheet stack 106a and the bottommost layer 108d of second nanosheet stack 106b. SiGe layer 112 is different than the SiGe layers 108. For example, in one illustrative embodiment, SiGe layer 112 is SiGe$_{65}$ and SiGe layers 108 are SiGe$_n$.

Second nanosheet stack 106b includes a bottom-most layer of SiGe 108d and a top-most layer of Si 110d. Second nanosheet stack 106b is depicted with four layers (two SiGe layers and two Si layers), however any number and combination of layers can be used so long as the layers alternate between SiGe and Si.

First nanosheet stack 106a, SiGe layer 112 and second nanosheet stack 106b are depicted with the layers being in the form of nanosheets, however the width of any given nanosheet layer can be varied so as to result in the form of a nanowire, a nanoellipse, a nanorod, etc. SiGe layers 108 and SiGe layer 112 can be composed of, for instance, SiGe$_{20-60}$, examples thereof including, but not limited to SiGe$_{20}$, SiGe$_{25}$, SiGe$_{30}$ ... SiGe$_{65}$ as long as SiGe layers 108 are different than SiGe layer 112 so layer 112 can be selectively removed with respect to other layers as described hereinbelow.

Substrate 102 can be composed of any currently known or later developed semiconductor material such as, for example, silicon (Si), germanium (Ge), silicon germanium (SiGe) at various Si and Ge concentrations, silicon carbide (SiC), Si:C (carbon doped silicon), silicon germanium carbide (SiGeC), carbon doped silicon germanium (SiGe:C), compound semiconductor materials (e.g. Groups III-V), or other like semiconductor material. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide.

An insulating layer 104 may be present on substrate 102 and, if present, is located between substrate 102 and first nanosheet stack 106a. Insulating layer 104 can be, for example, a buried oxide layer (typically SiO$_2$) or a bottom dielectric isolation layer formed early in the process (typically SiN, SiBCN, SiOCN, SiOC, or any combination of low-k materials).

Semiconductor structure 100 also depicts the result of forming at least one dummy gate 114 on second nanosheet stack 106b. Three dummy gates 114 are shown however any number of gates 114 can be formed. Dummy gates 114 can be formed by first depositing a dummy gate material over and around the first and second nanosheet stacks 106a and 106b (not shown) by any conventional technique such as, for example, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation. Suitable dummy gate material includes, for example, polycrystalline silicon, amorphous silicon or microcrystal silicon. Dummy gate 114 can then be subjected to a planarizing process such as a chemical mechanical planarization (CMP) operation.

A hardmask 116 is then deposited over the planarized dummy gate material and patterned to form hardmask 116 on dummy gates 114. An etching process, e.g., a reactive ion etching (RIE), is applied to form the dummy gates 114. Suitable material for hardmask 116 includes, for example, Si$_3$N$_4$, SiBCN, SiNC, SiN, SiCO, SiO$_2$, and SiNOC.

Figure 3:
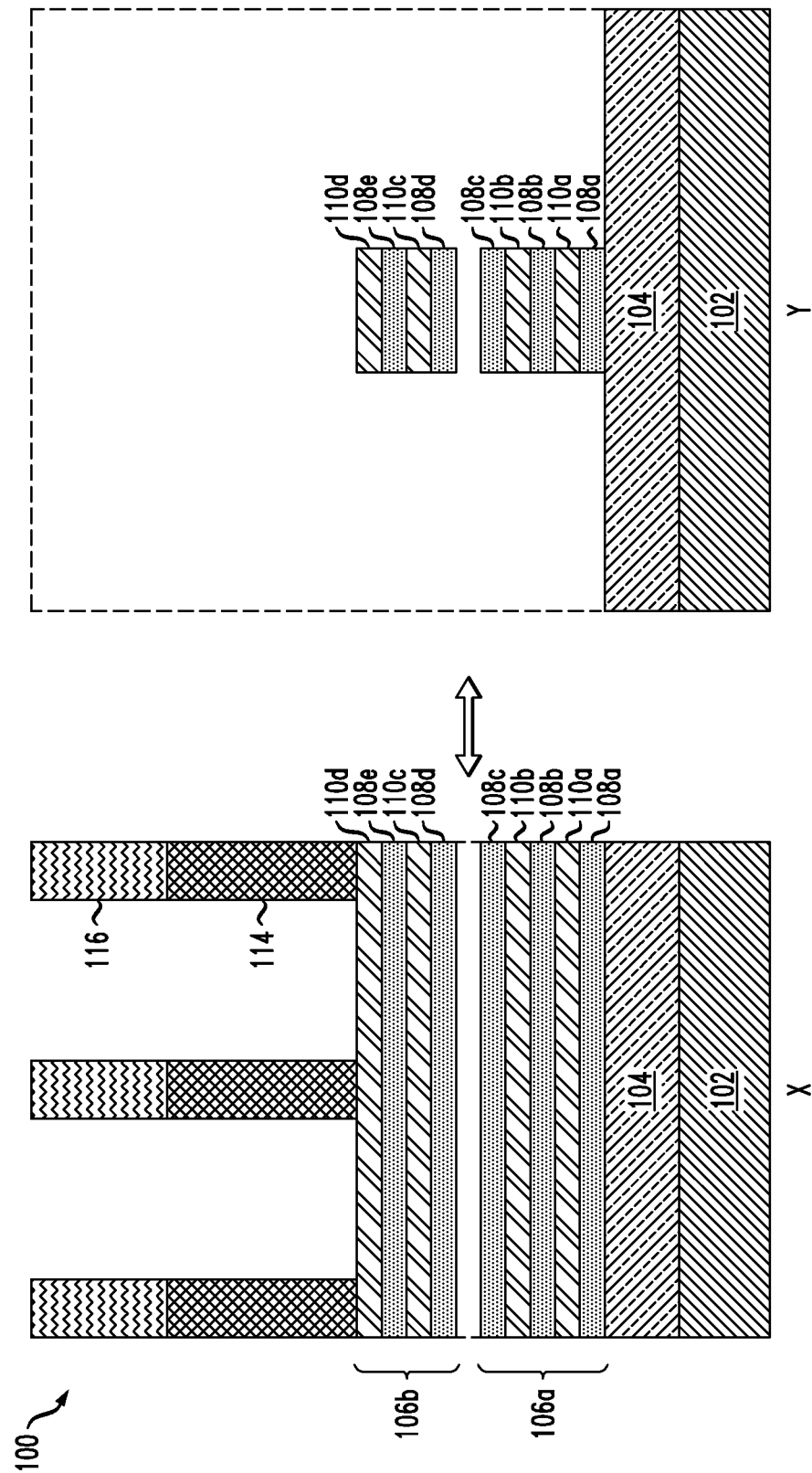
FIG. 3 is a cross sectional view of the semiconductor structure of FIG. 1 at a second-intermediate fabrication stage, according to an illustrative embodiment.

FIG. 3 illustrates the structure 100 at a second-intermediate stage. During this stage, SiGe layer 112 is removed by an etching process such as an isotropic etch process to form an opening, e.g., using vapor phased HCl. It is to be appreciated that the dashed lines in both the X and Y cross section locations indicate support for connecting nanosheet stacks 106a and 106b to semiconductor structure 100. In particular, dummy gate 114 and hardmask 116 are continuous and wrap around nanosheet stacks 106a and 106b.

Figure 4:
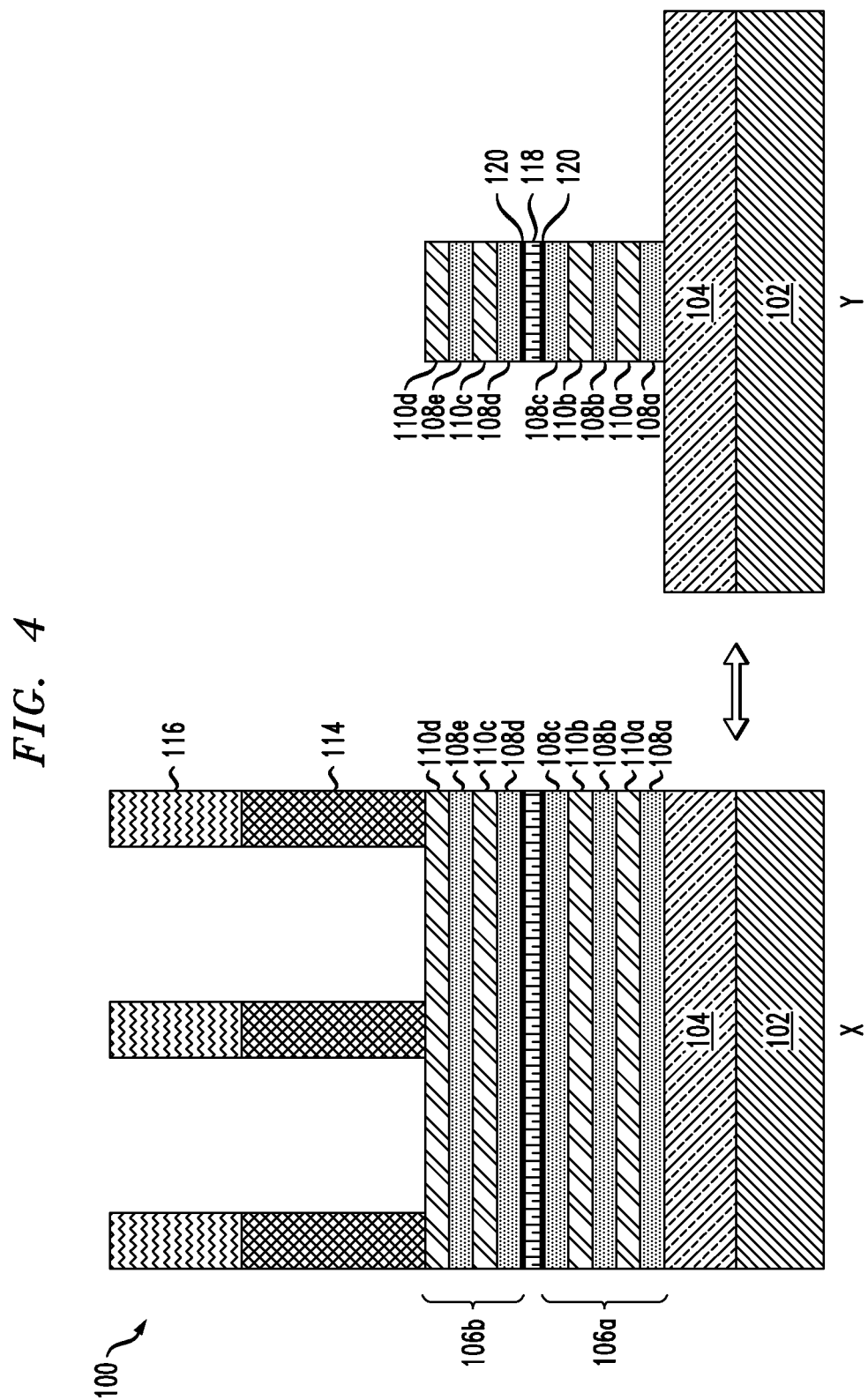
FIG. 4 is a cross sectional view of the semiconductor structure of FIG. 1 at a third-intermediate fabrication stage, according to an illustrative embodiment.
Figure 5:
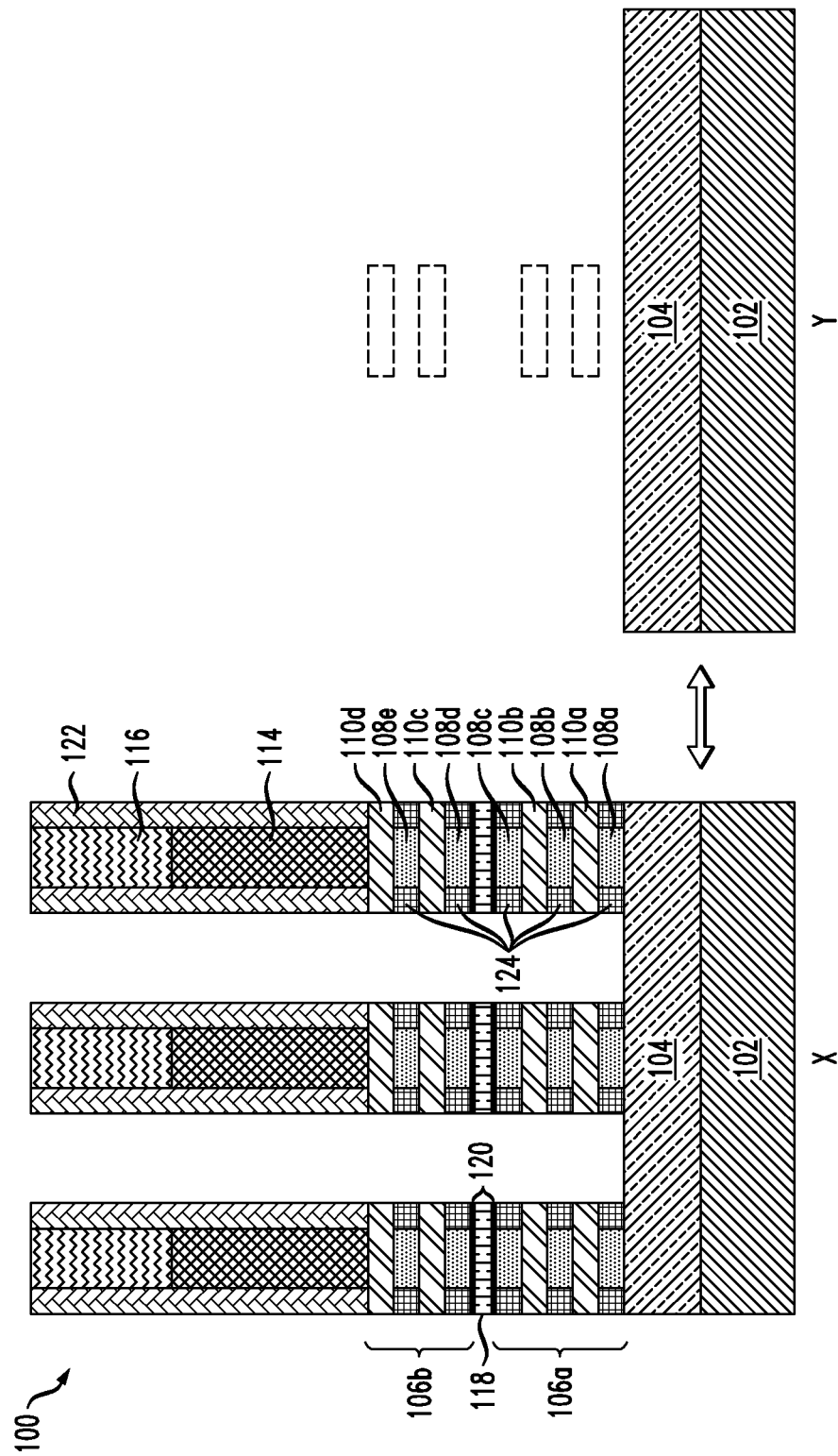
FIG. 5 is a cross sectional view of the semiconductor structure of FIG. 1 at a fourth-intermediate fabrication stage, according to an illustrative embodiment.

FIG. 4 illustrates the structure 100 at a third-intermediate stage. During this stage, a sacrificial layer 118 and liner layers 120 are deposited in the opening between the upper surface of first nanosheet stack 106a and bottom surface of second nanosheet stack 106b. The sacrificial layer 118 can be a sacrificial material, such as TiOx, TiN, AlOx, etc. The lining material of liner layer 120 may be any suitable lining material, for example, a very thin layer of dielectric, such as SiN. The deposition of sacrificial layer 118 and liner layer 120 is conformal until the gap is pinched-off, followed by an isotropic etch back process to remove the materials elsewhere except the region in the gap, In one embodiment, sacrificial layer 118 can have a thickness ranging from about 6 to about 20 nanometers (nm). In one embodiment, liner layer 120 can have a thickness ranging from about 1 to about 3 nm, FIG. 5 illustrates the structure 100 at a fourth-intermediate stage. During this stage, gate spacers 122 are formed on sidewalls of dummy gates 114 and can extend upward along sidewalls of hardmask 116 as well. Gate spacers 122 may be the same material or a different material than hardmask 116. Suitable material includes, for example, $Si_3N_4$, SiBCN, SiNC, SiN, SiCO, $SiO_2$, and SiNOC. Gate spacers 122 can be formed by any conventional technique such as, for example, CVD, PECVD, PVD, ALD, and the like followed by anisotropic RIE to remove the spacer from the horizontal surface.

Next, the exposed portion of second nanosheet stack 106b together with sacrificial layer 118, liner layer 120 and first nanosheet stack 106a between adjacent dummy gates 114, i.e., the portions which are not underneath gate spacers 122 and dummy gates 114 are removed by etching to expose a top surface of insulator layer 104. Etching can be carried out by using a directional etching technique such as RIE After etching is completed, SiGe layers 108a-c of first nanosheet stack 106a and SiGe layers 108d-e of second nanosheet stack 106b are laterally etched to remove a portion of each of SiGe layers 108 and form a divot (not shown). The lateral etching of SiGe layers 108a-e may be performed using, for example, an isotropic etch such as gas phase etch, plasm etch, or wet etch. Inner spacers 124 are then formed in the etched portions of SiGe layers 108a-e. Inner spacers 124 can be composed of any suitable dielectric material, for example silicon nitride, silicon oxide, silicon dioxide, silicon oxynitride, SiCN, SiOCN, SiOC, SiBCN, a dielectric metal oxide, a dielectric metal nitride, or a combination thereof. In one embodiment, the dielectric material is silicon nitride. Inner spacers 124 can be formed by techniques known in the art. For example, a thin dielectric layer can be deposited on substrate 102 and over dummy gates 114 and filling the divots thus formed. The dielectric layer can be deposited using a deposition process, such as CVD, ALD, PECVD, metal organic chemical vapor deposition (MOCVD) or other like chemical vapor deposition processes. Next, the dielectric layer is selectively etched by an etch back process to remove the dielectric layer from the exterior surface of structure 100 while leaving the dielectric layer in the space defined by the divots to form inner spacers 124. In this exemplary embodiment, the dielectric layer can be etched back to the level of the exterior surface of first nanosheet stack 106a and second nanosheet stack 106b by, for example, an isotropic etching process such as vapor phased dry etch or wet etching.

Figure 6:
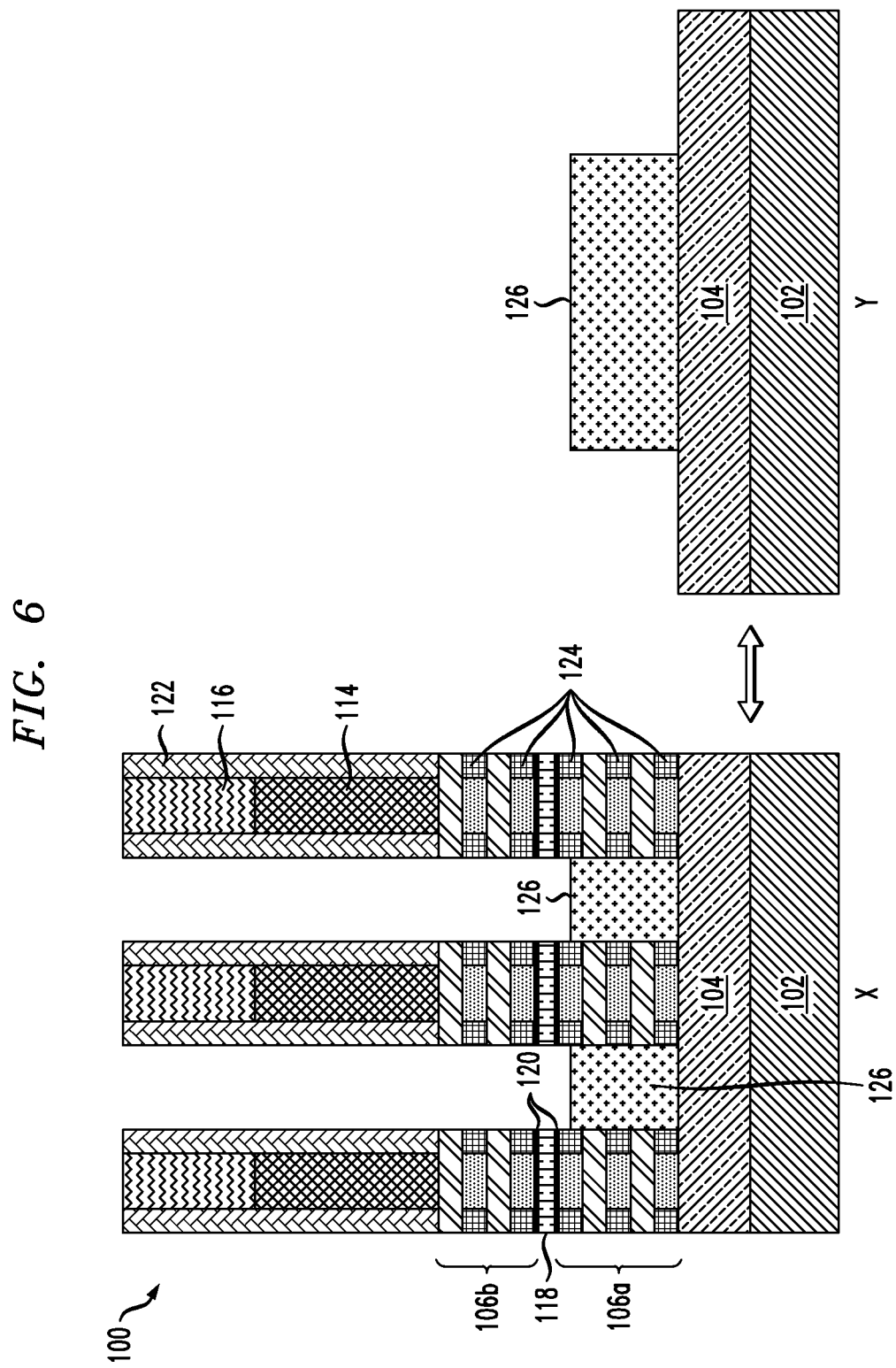
FIG. 6 is a cross sectional view of the semiconductor structure of FIG. 1 at a fifth-intermediate fabrication stage, according to an illustrative embodiment.

FIG. 6 illustrates the structure 100 at a fifth-intermediate stage. During this stage, bottom source/drain regions 126 are formed as follows, for example, a source drain epi layer (NFET S/D epi or PFET S/D epi) will be first formed on the exposed sidewall of nanosheets of 106a and 106b. Next, an etching process is applied to recess the epitaxy layer grown over top sheets 106b, followed by a further litho patterning and etching process to etch away any undesired bottom S/D epi. The epitaxially grown bottom source/drain regions 126 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1×10^{18}/cm^3$ to $1×10^{21}/cm^3$. According to an embodiment, the bottom source/drain regions 126 can include a boron doped SiGe, or a phosphorous doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

Figure 7:
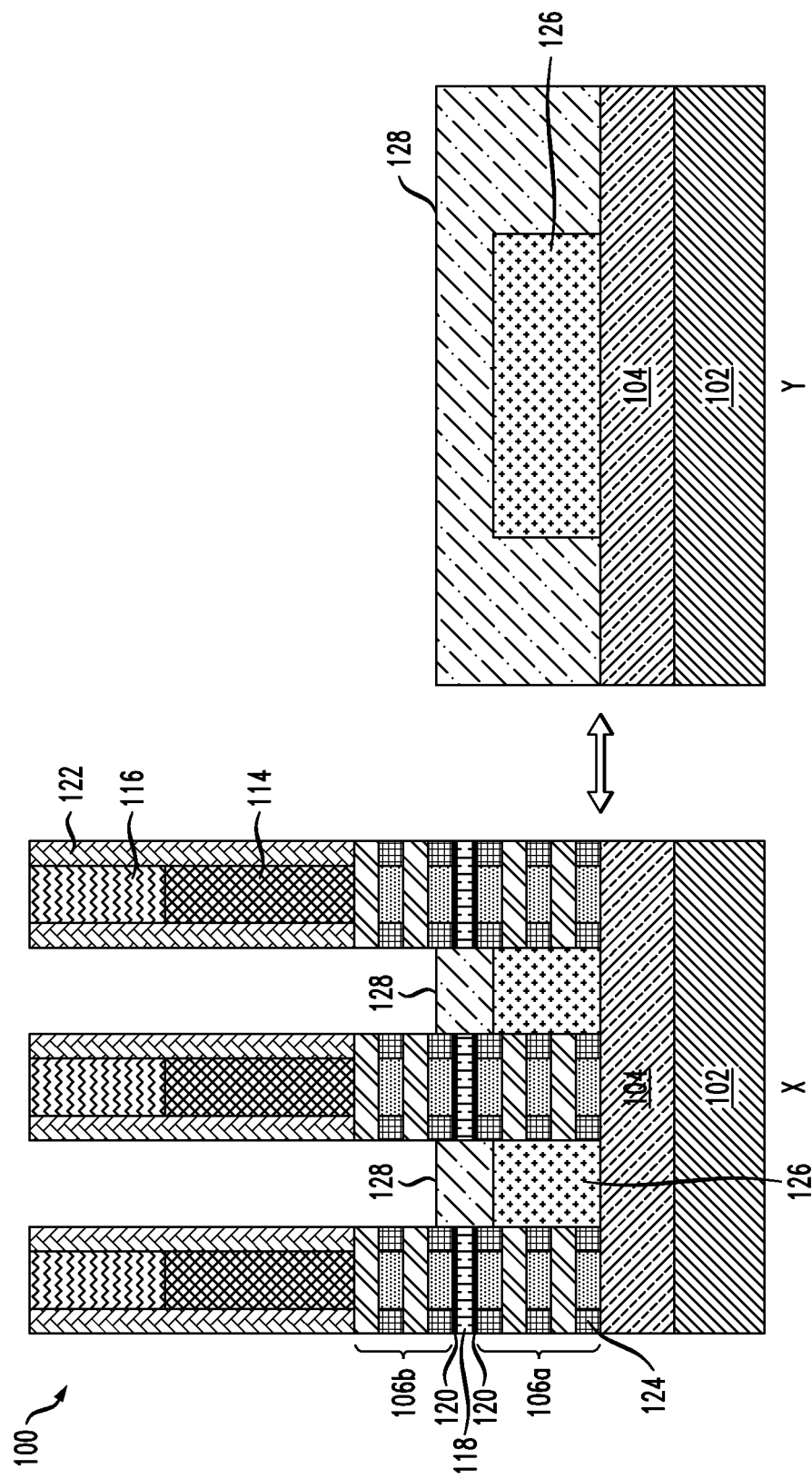
FIG. 7 is a cross sectional view of the semiconductor structure of FIG. 1 at a sixth-intermediate fabrication stage, according to an illustrative embodiment.

FIG. 7 illustrates the structure 100 at a sixth-intermediate stage. During this stage, a sacrificial isolation layer 128 can be deposited on exposed surfaces of bottom source/drain regions 126 and insulator layer 104 by spin coating, CVD or any known method. Suitable material for sacrificial isolation layer 128 can be any of those used for sacrificial isolation layer 120, e.g., TiOx, AlOx, GeOx and the like. In one embodiment, the material for sacrificial isolation layer 128 is the same as the material for sacrificial layer 118. Next, the sacrificial layer 128 is recessed such that sidewall surfaces of nanosheet stack 106b are exposed.

Figure 8:
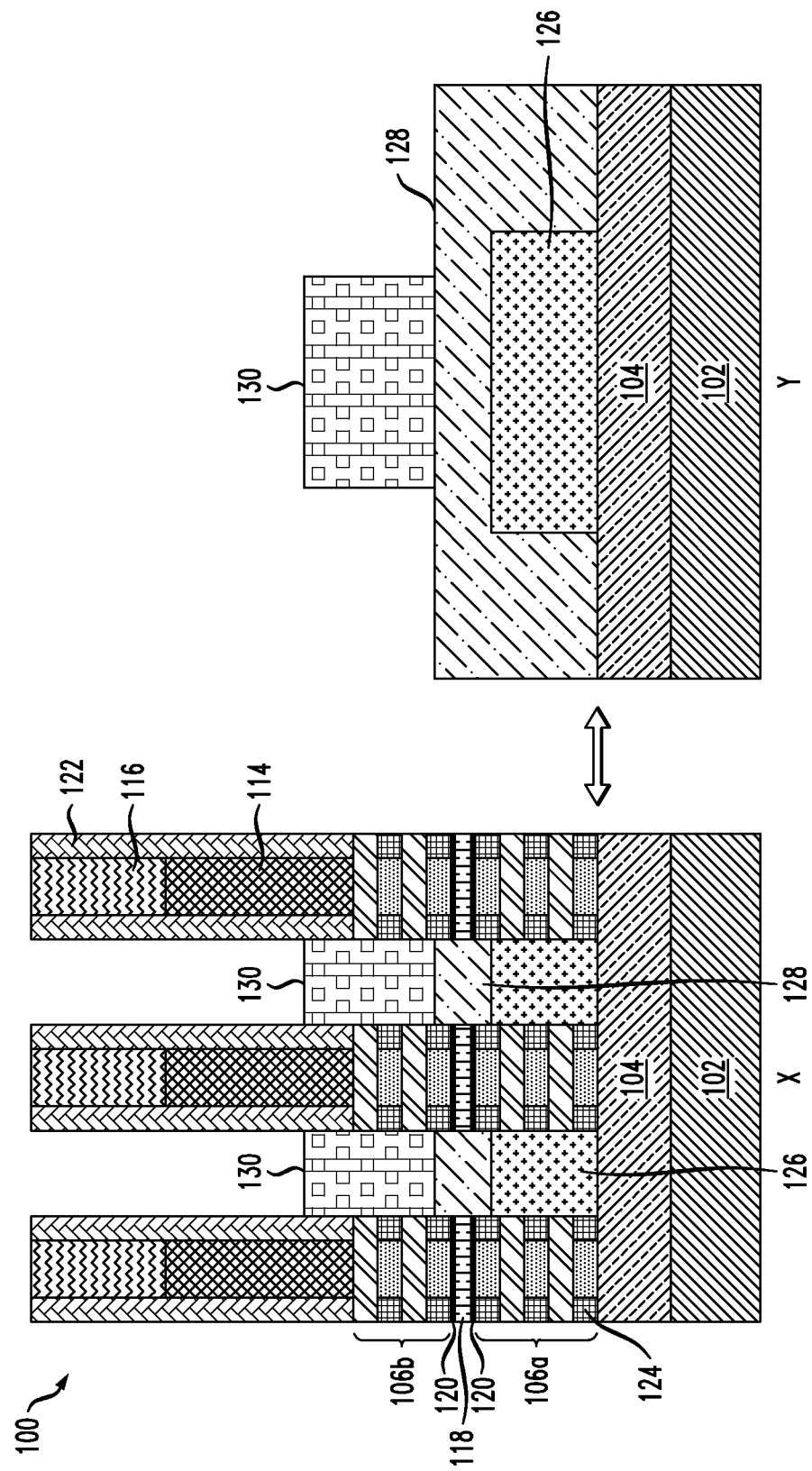
FIG. 8 is a cross sectional view of the semiconductor structure of FIG. 1 at a seventh-intermediate fabrication stage, according to an illustrative embodiment.

FIG. 8 illustrates the structure 100 at a seventh-intermediate stage. During this stage, top source/drain regions 130 are formed, for example, in the PFET or NFET region, on at least a portion of sacrificial isolation layer 128 and around second nanosheet stack 106b and a portion of gate spacers 122. Top source/drain regions 130 can be formed in a similar manner as discussed above for bottom source/drain regions 126.

Figure 9:
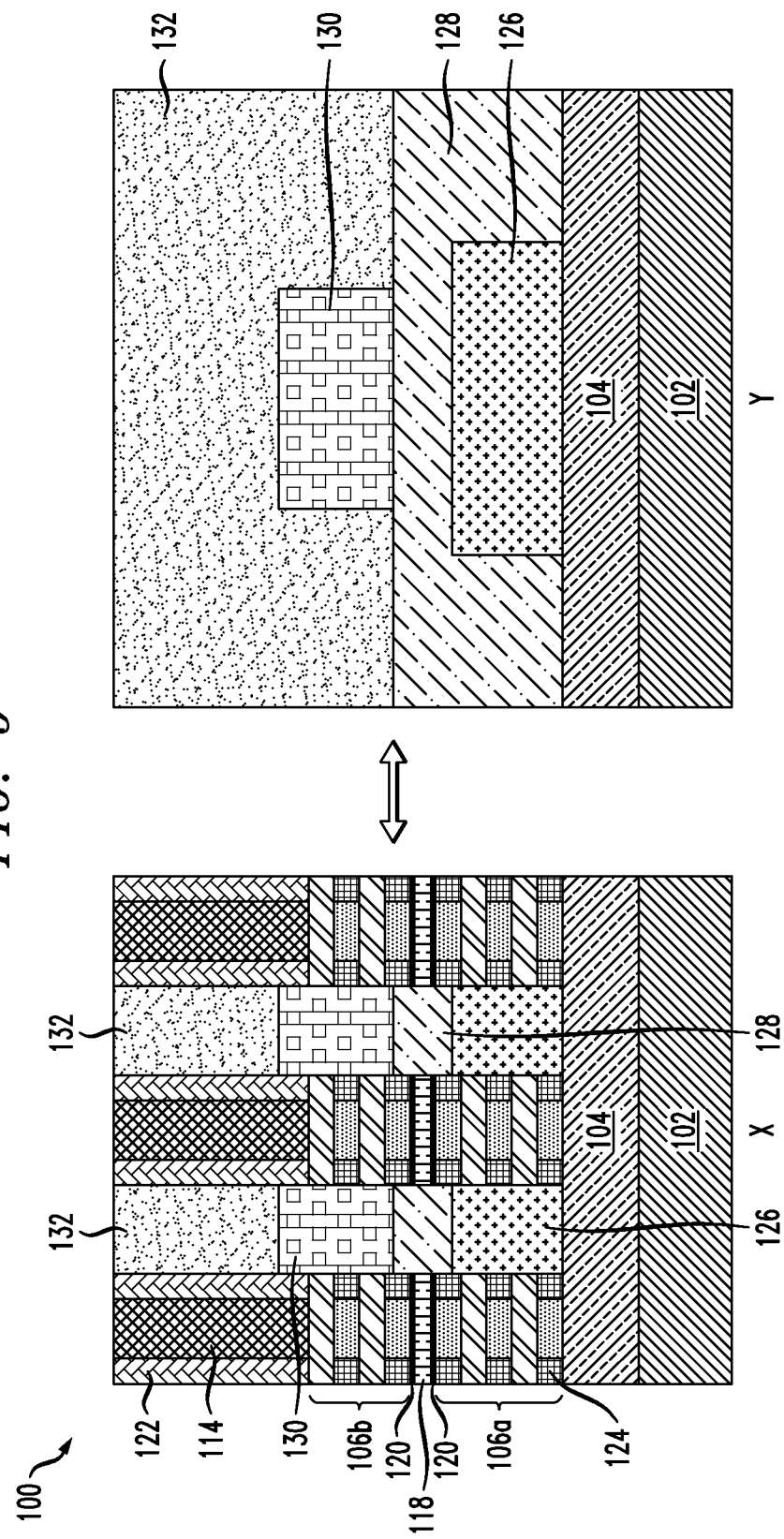
FIG. 9 is a cross sectional view of the semiconductor structure of FIG. 1 at an eighth-intermediate fabrication stage, according to an illustrative embodiment.

FIG. 9 illustrates the structure 100 at an eighth-intermediate stage. During this stage, an interlevel dielectric (ILD) layer 132 is deposited on a top surface of top source/drain regions 130 between adjacent dummy gates 114 and on at least a portion of sacrificial isolation layer 128. The ILD layer 132 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high-density plasma oxide, borophosphosilicate glass (BPSG), or any combination thereof. The ILD layer 132 may be formed using any suitable deposition techniques including CVD, ALD, PVD, PECVD, chemical solution deposition or other like processes. Hardmask 116 and gate spacers 122 along ILD layer 132 are then removed and the top surface of structure 100 is then planarized by, for example, a planarization process such as CMP, such that ILD layer 132 is coplanar with dummy gate 114 and gate spacers 122 on its sidewalls.

Figure 10:
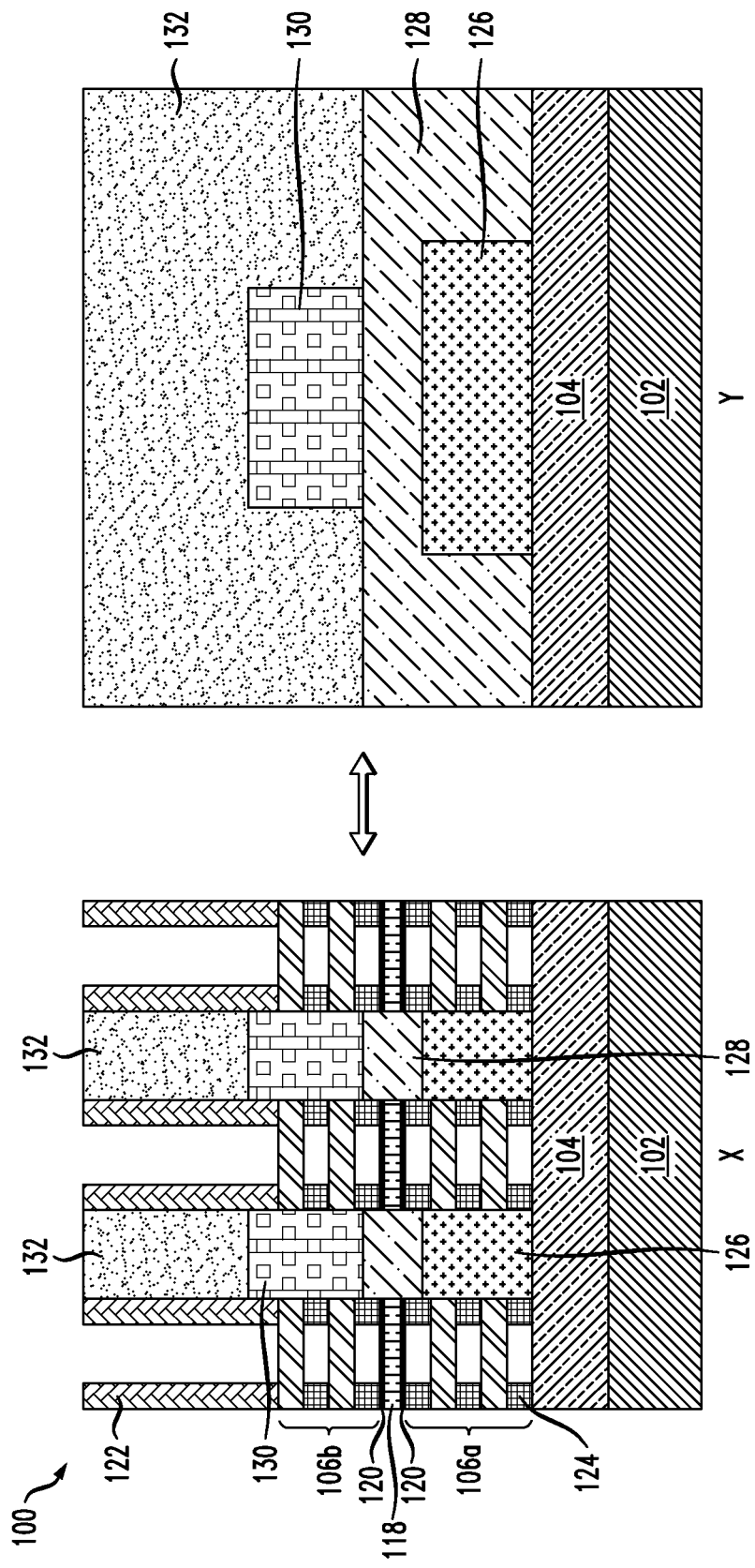
FIG. 10 is a cross sectional view of the semiconductor structure of FIG. 1 at a ninth-intermediate fabrication stage, according to an illustrative embodiment.

FIG. 10 illustrates the structure 100 at a ninth-intermediate stage. During this stage, dummy gates 114 and SiGe nanosheet stack layers 108 are selective removed (see white voids in figure). Any known removal process may be used that is appropriate for the material being removed. Dummy gate 114 can be removed by, for example, hot ammonia followed by DHF. SiGe nanosheet stack layers 108 can be removed by vapor phased HCl at a suitable temperature.

Figure 11:
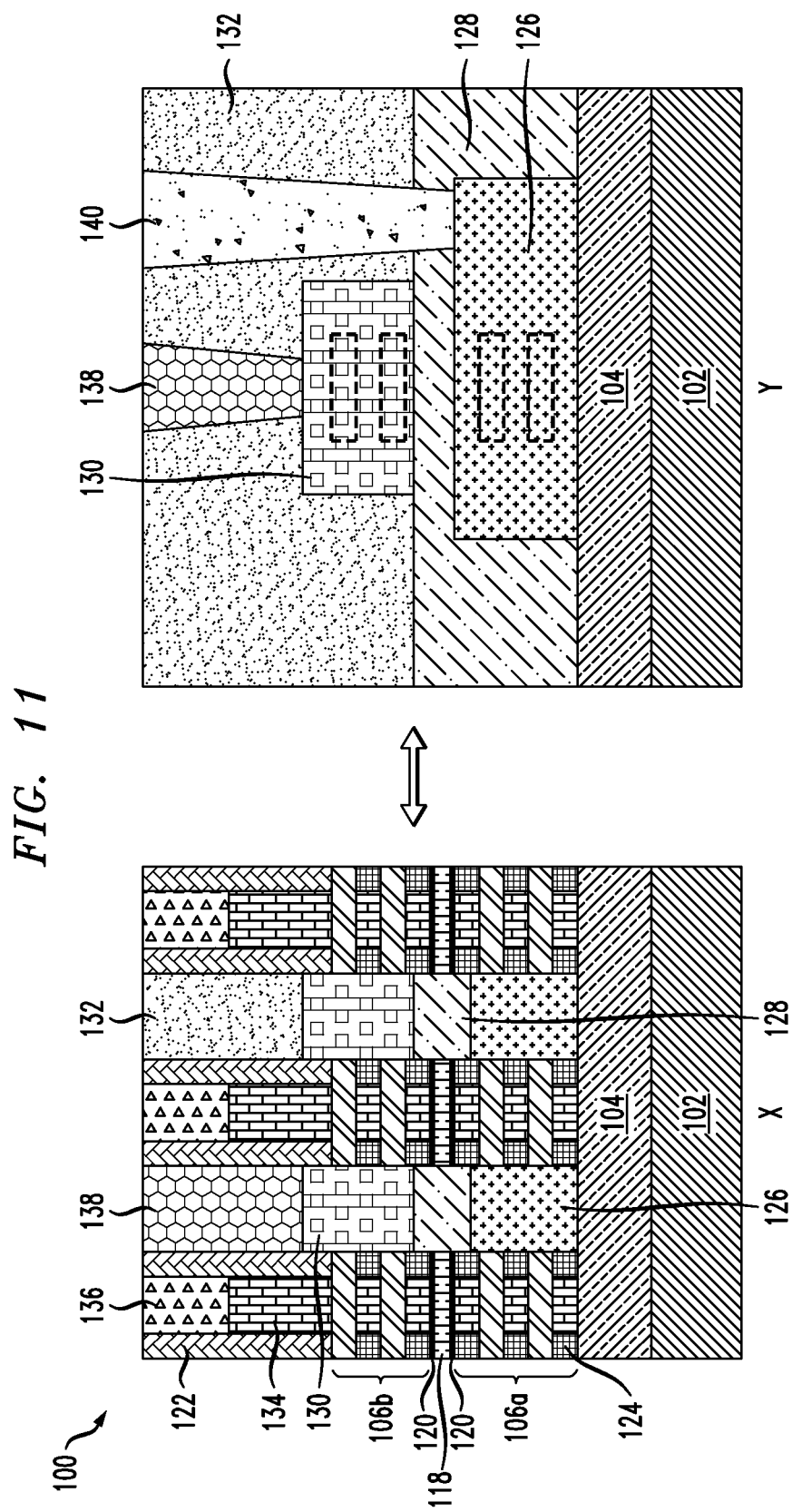
FIG. 11 is a cross sectional view of the semiconductor structure of FIG. 1 at a tenth-intermediate fabrication stage, according to an illustrative embodiment.

FIG. 11 illustrates the structure 100 at a tenth-intermediate stage. During this stage, a replacement metal gate 134 such as a high-k metal gate (HKMG) is formed in place of each dummy gate 114 and SiGe nanosheet stack layer 108 (i.e., forming replacement metal gate 134 in the locations noted by the white voids in FIG. 10) by known processes. The high-k dielectric material of replacement metal gate 134 can be any suitable high-k dielectric material, for example, $HfO_2$ and $ZrO_2$. The replacement metal gate 134 can further include a work function metal (not shown) such as TiN, TiC, TiAl, TaN, etc. and one or more low resistance conducting metals such as W, Co and Ru.

A self-aligned contact (SAC) cap 136 is then formed on the top surface of replacement metal gate 134. The terms "SAC cap" and "self-aligned contact cap" may be used interchangeably herein to refer to the protective material over the metal gate 134. The SAC cap 136 may be, for example, a nitride material such as, silicon nitride (SiN), $Si_3N_4$, SiBCN, SiNC and SiNOC, or another insulating material such as SiCO and $SiO_2$. Planarization, for example, CMP, may be performed to the device to remove the excess SAC cap 136 on semiconductor structure 100 to form SAC caps 136.

Next, metal contacts including top source/drain contact 138, bottom source/drain contact 140, and a metal gate contact (not shown) are formed. For example, bottom source/drain contact 140 is an electrical contact that provides electrical connectivity to a bottom source/drain region. Top source/drain contact 138 is an electrical contact that provides electrical connectivity to a top source/drain region. For example, a circuit external to the VFET uses top source/drain contact 138 to electrically connect a part of the circuit to a top source/drain region in a VET. Metal gate contact is an electrical connection to a gate. A circuit external to the VFET uses the metal gate contact to electrically connect a part of the circuit to a gate in the VFET.

The metal contacts are formed by first forming conductive vias or trenches by methods known in the art, e.g., selectively etching through the ILD layer 132 by, for example, RIE, such that the via is communicative with the respective component, e.g., conductive vias or trenches for metal contacts 140 communicative with the respective bottom source/drain region 126. A conductive material is then deposited within the via. The conductive material for top source/drain contact 138, bottom source/drain contact 140, and metal gate contact can be of the same or different material. The conductive material can include any suitable conductive material such as, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

Figure 12:
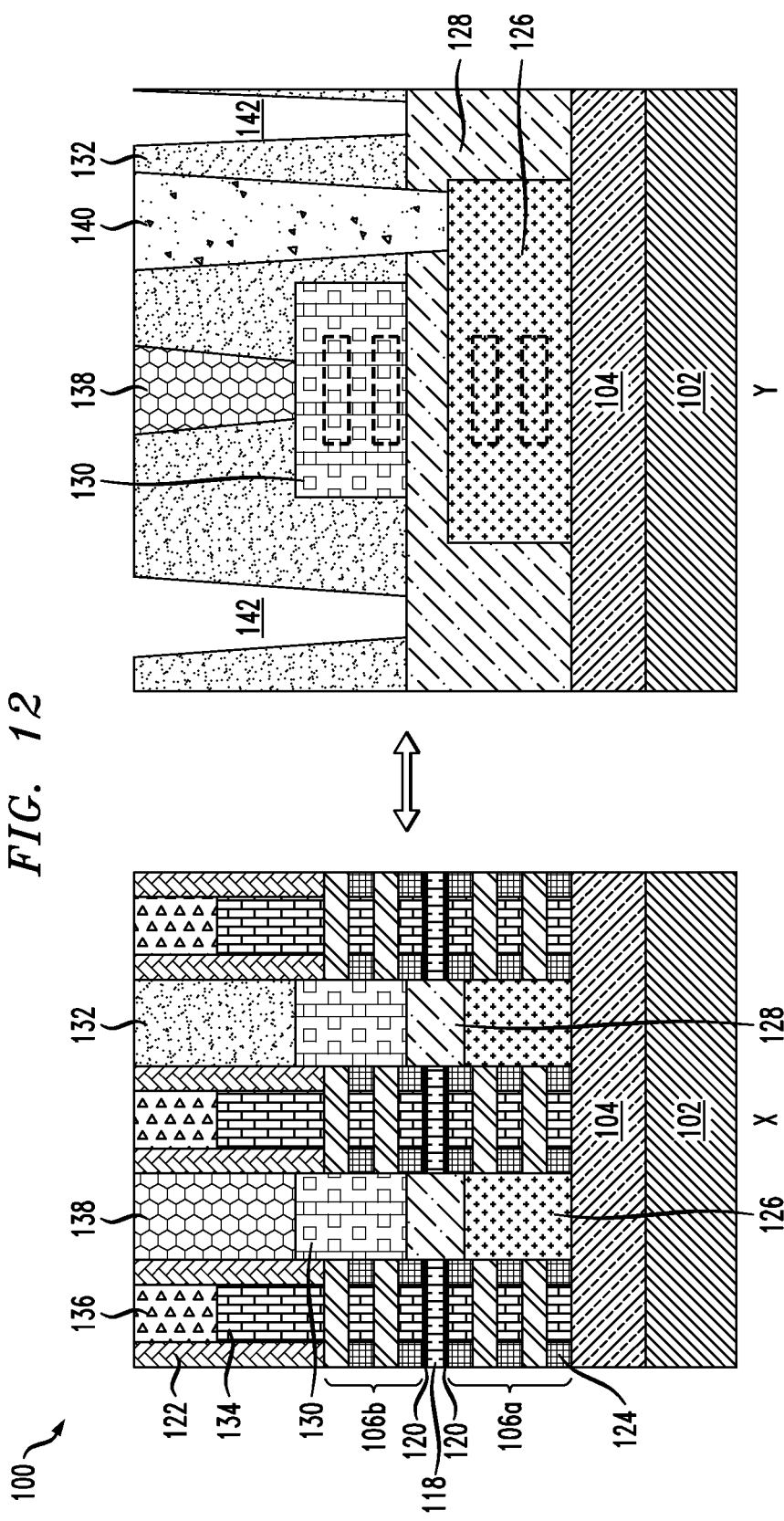
FIG. 12 is a cross sectional view of the semiconductor structure of FIG. 1 at an eleventh-intermediate fabrication stage, according to an illustrative embodiment.

FIG. 12 illustrates the structure 100 at an eleventh-intermediate stage. During this stage, one or more trenches 142 for formed in ILD layer 132 to expose a top surface of sacrificial isolation layer 128. Trenches 142 can be formed by selectively etching through the ILD layer 132 by, for example, RIE.

Figure 13:
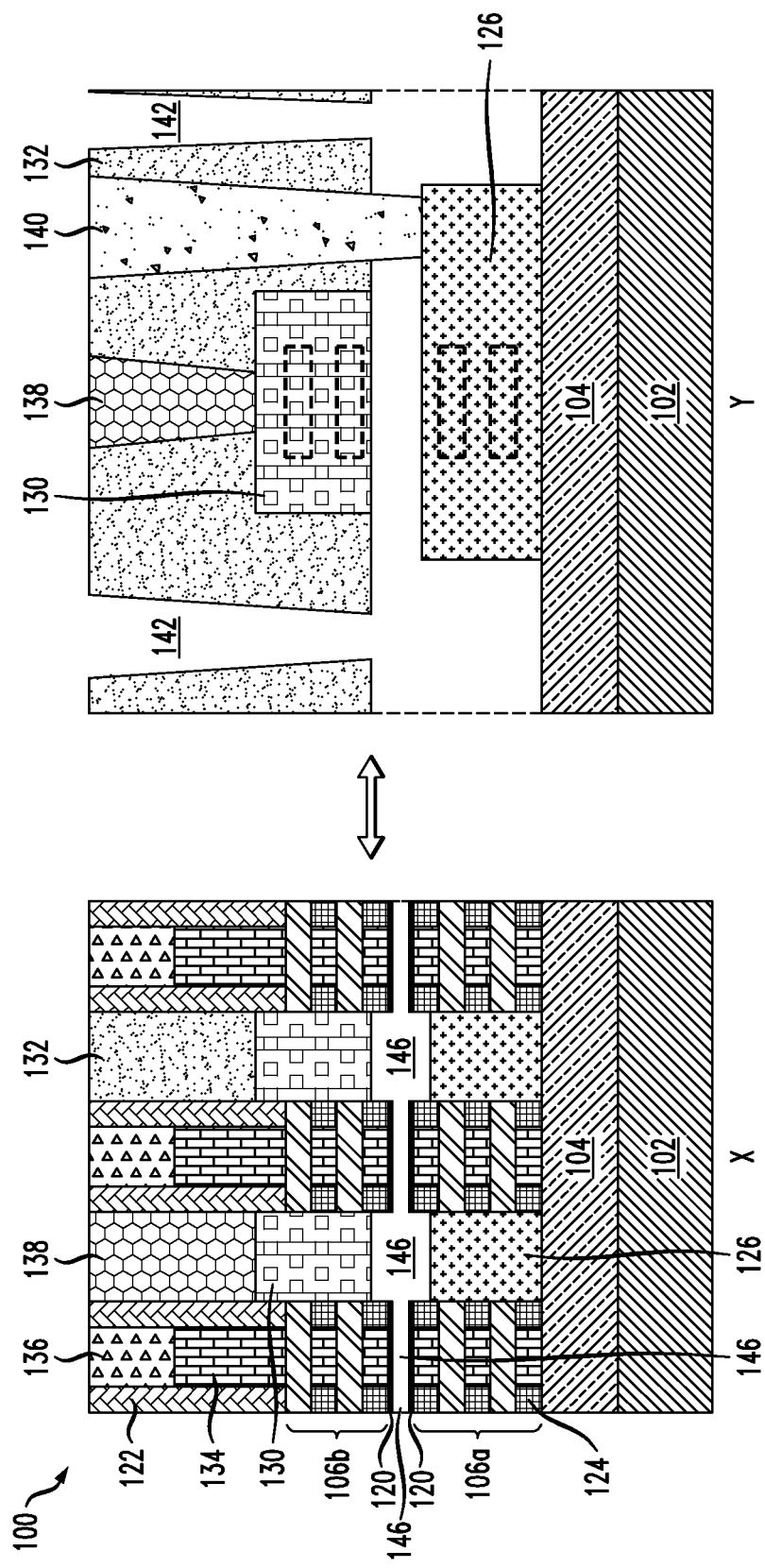
FIG. 13 is a cross sectional view of the semiconductor structure of FIG. 1 at a twelfth-intermediate fabrication stage, according to an illustrative embodiment.

FIG. 13 illustrates the structure 100 at a twelfth-intermediate stage. During this stage, sacrificial isolation layers 118 and 128 are removed. For example, sacrificial isolation layers 118 and 128 can be removed by a wet etching process. In one embodiment, a wet etching process may include an SC-1 (ammonium hydroxide and/or hydrogen peroxide) etchant. By removing sacrificial isolation layers 118, an air gap 146 is formed between liner layers 120, and between layers 126 and 130. Air gap 146 may be comprised of a gas from the ambient air, or may be comprised of an inert gas, e.g., nitrogen gas, helium, etc. In one embodiment, air gap 146 has a k value less than or equal to about 1.5.

Figure 14:
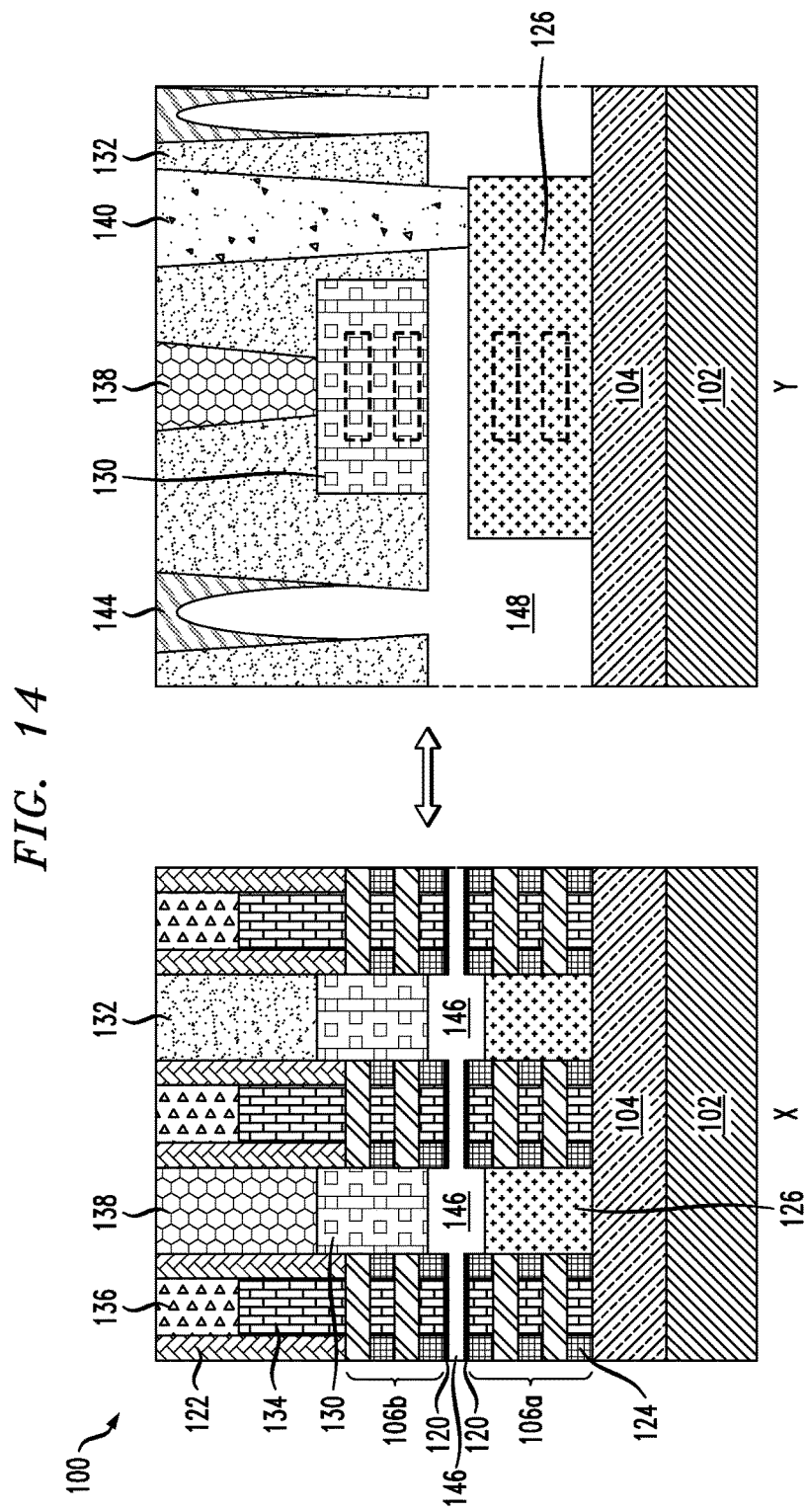
FIG. 14 is a cross sectional view of the semiconductor structure of FIG. 1 at a thirteenth-intermediate fabrication stage, according to an illustrative embodiment.

FIG. 14 illustrates the structure 100 at a thirteenth-intermediate stage. During this stage, an air gap 148 is formed after depositing dielectric top layer 144 in the opening that was formed during the process described in FIG. 12. Air gap 148 may be comprised of a gas from the ambient air, or may be comprised of an inert gas, e.g., nitrogen gas, helium, etc. In one embodiment, air gap 148 has a k value less than or equal to about 1.5.

For example, the air gap shown in FIG. 14, such as air gap 148, may be formed via a single-step dielectric deposition process or a two-step dielectric deposition process. The dielectric 144 can be, for example, a nitride dielectric such as SiN or SiBCN. In the single-step deposition process, an air gap is formed with a specific thickness and conformality associated with a single dielectric deposition. Thus, the single-step dielectric deposition process does not necessarily provide for adjusting the height of air gaps and controlling the shape and/or dimensions of the air gaps. For example, dielectric top layer 144 can be deposited using a relatively low temperature (e.g., 350° C.) PECVD process. With the deposition of the dielectric top layer 144, the air gap 146 is sealed between the dielectric top layer 144 and the top surface of the insulator layer 104. The deposition process is not conformal such that top opening is quickly pinch-off and not much deposition happens in the bottom of the openings 148 and 146, leaving a sealed airgap.

It is to be understood that the methods discussed herein for fabricating a reduced coupling effect in semiconductor structures (e.g., SFETs) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for forming a semiconductor structure, comprising:
    forming a first set of nanosheet layers and a second set of nanosheet layers on a substrate, wherein each of the first set of nanosheet layers and the second set of nanosheet layers comprises alternating silicon layers and silicon-germanium layers, and wherein the first set of nanosheet layers and the second set of nanosheet layers are separated by a first sacrificial isolation layer;
    forming a bottom source/drain region on the substrate and in contact with the first set of nanosheet layers;
    forming a second sacrificial isolation layer on at least the bottom source/drain region;
    forming a top source/drain region on at least a portion of the second sacrificial isolation layer;
    depositing an interlevel dielectric layer on the top source/drain region and the second sacrificial isolation layer;
    forming one or more trenches in the interlevel dielectric layer and exposing a top surface of the second sacrificial isolation layer; and
    removing the second sacrificial isolation layer to form an air gap positioned between the bottom source/drain region and the top source/drain region.

2. The method of claim 1, further comprising:
    forming a first metal contact to provide electrical contact with the bottom source/drain region; and
    forming a second metal contact to provide electrical contact with the top source/drain region.

3. The method of claim 1, wherein a bottom-most nanosheet layer and a top-most nanosheet layer of the first set of nanosheet layers are silicon-germanium layers and further wherein the bottom-most nanosheet layer of the second set of nanosheet layers is a silicon-germanium layer and the top-most nanosheet layer of the second set of nanosheet layers is a silicon layer.

4. The method of claim 1, wherein the first set of nanosheet layers and the second set of nanosheet layers each comprise a divot in respective silicon-germanium layers, wherein an inner spacer is formed within the divot.

5. The method of claim 1, wherein forming the first set of nanosheet layers and the second set of nanosheet layers comprises:
    epitaxially growing the first set of nanosheet layers, wherein a bottom-most layer of the first set of nanosheet layers is a first silicon-germanium layer and a top-most layer of the first nanosheet layers is a second silicon-germanium;
    forming a third silicon-germanium layer on the top-most second silicon-germanium layer of the first set of nanosheet layers, wherein the third silicon-germanium layer is different than the first silicon-germanium layer and the second silicon-germanium layer;
    epitaxially growing the second set of nanosheet layers on the third silicon-germanium layer, wherein a bottom-most layer of the second set of nanosheet layers is a first silicon-germanium layer and a top-most layer of the second set of nanosheet layers is a silicon layer, wherein the third silicon-germanium layer is different than the first silicon-germanium layer;
    forming a plurality of dummy gates on a portion of the top-most layer of the second nanosheet stack, the plurality of dummy gates being protected by a hardmask on a top surface thereof;
    forming gate spacers on sidewalls of each of the plurality of dummy gates and sidewalls of the hardmask;
    replacing the third silicon-germanium layer with the first sacrificial isolation layer; and
    etching the first set of nanosheet layers, the first sacrificial isolation layer and the second set of nanosheet layers such that portions of the first set of nanosheet layers, the first sacrificial isolation layer and the second set of nanosheet layers not underneath the gate spacers and the plurality of dummy gates are removed.

6. The method of claim 5, further comprising:
    selectively etching a portion of the silicon-germanium layers of the first set of nanosheet layers and the second set of nanosheet layers; and
    forming inner spacers in the etched portions of the silicon-germanium layers.

7. The method of claim 6, further comprising:
    removing the hardmask, the plurality of dummy gates and the silicon-germanium layers of the first set of nanosheet layers and the second set of nanosheet layers;
    forming a replacement metal gate in place of the removed dummy gate and removed silicon-germanium layers of the first set of nanosheet layers and the second set of nanosheet layers; and
    forming a cap over a top surface of the replacement metal gate.

8. The method of claim 7, wherein the replacement metal gate is a high-k metal gate.

9. The method of claim 7, further comprising:
    forming a first metal contact to provide electrical contact with the bottom source/drain region;
    forming a second metal contact to provide electrical contact with the top source/drain region; and
    forming a third metal contact to provide electrical contact with the replacement metal gate.

10. The method of claim 7, further comprising removing the first sacrificial isolation layer to form another air gap positioned between a top-most replacement metal gate of the first set of nanosheet layers and a bottom-most replacement metal gate of the second set of nanosheet layers.

11. The method of claim 1, further comprising depositing a dielectric layer in at least a top portion of the one or more trenches, wherein the dielectric layer seals the air gap positioned between the bottom source/drain region and the top source/drain region.

12. A method of forming a stacked integrated circuit structure, comprising:
    forming a plurality of stacked field-effect transistors comprising a first field-effect transistor and a second field-effect transistor on a substrate, wherein the first field-effect transistor and the second field-effect transistor are separated by a first sacrificial isolation layer, wherein the first field-effect transistor comprises a first metal gate and a first source/drain region, wherein the second field-effect transistor comprises a second metal gate, and a second source/drain region, wherein the first metal gate and the second metal gate are vertically aligned, and wherein the first source/drain region and the second source/drain region are vertically aligned and separated by a second sacrificial isolation layer;

forming an interlevel dielectric layer over the second source/drain region and on the second sacrificial isolation layer;

forming one or more trenches in the interlevel dielectric layer and exposing a top surface of the second sacrificial isolation layer; and removing the second sacrificial isolation layer to form an air gap positioned between the first source/drain region and the second source/drain region.

13. The method of claim 12, further comprising:
forming a first metal contact to provide electrical contact with the first source/drain region; and
forming a second metal contact to provide electrical contact with the second source/drain region.

14. The method of claim 12, wherein forming the plurality of stacked field-effect transistors comprises:
epitaxially growing a first set of nanosheet layers comprising alternating layers of silicon-germanium and silicon, wherein a bottom-most layer of the first set of nanosheet layers is a silicon-germanium bottom layer and a top-most layer of the first nanosheet layers is a silicon-germanium top layer;
forming a silicon-germanium isolation layer on the silicon-germanium top layer of the first set of nanosheet layers, wherein the silicon-germanium isolation layer is different than the silicon-germanium bottom layer and the second silicon-germanium top layer;
epitaxially growing a second set of nanosheet layers comprising alternating layers of silicon-germanium and silicon, a bottom-most layer of the second set of nanosheet layers is a silicon-germanium bottom layer and a top-most layer of the second set of nanosheet layers is a silicon top layer;
forming a plurality of dummy gates on a portion of the top-most layer of the second set of nanosheet layers, the plurality of dummy gates being protected by a hardmask on a top surface thereof;
forming gate spacers on sidewalls of the plurality of dummy gates and sidewalls of the hardmask;
replacing the silicon-germanium isolation layer with the first sacrificial isolation layer; and
etching the first set of nanosheet layers, the first sacrificial isolation layer and the second set of nanosheet layers such that portions of the first set of nanosheet layers, the first sacrificial isolation layer and the second set of nanosheet layers not underneath the gate spacers and the plurality of dummy gates are removed;
selectively etching silicon-germanium layers of the first set of nanosheet layers and the second set of nanosheet layers such that portions of the silicon-germanium layers underneath the gate spacers are removed; and forming inner spacers in the etched portions of the silicon-germanium layers, the inner spacers being located under the gate spacers.

15. The method of claim 14, further comprising:
removing the hardmask, the plurality of dummy gates and the silicon-germanium layers of the first set of nanosheet layers and the second set of nanosheet layers;
forming a replacement metal gate in place of the removed dummy gates and removed silicon-germanium layers of the first set of nanosheet layers and the second set of nanosheet layers; and
forming a cap over a top surface of the replacement metal gate.

16. The method of claim 15, further comprising:
forming a first metal contact to provide electrical contact with the first source/drain region;
forming a second metal contact to provide electrical contact with the second source/drain region; and
forming a third metal contact to provide electrical contact with the replacement metal gate.

17. A semiconductor structure, comprising:
a first field-effect transistor disposed on a substrate, the first field-effect transistor comprising a first metal gate and a first source/drain region;
a second field-effect transistor vertically stacked above the first field-effect transistor, the second field-effect transistor comprising a second metal gate and a second source/drain region,
wherein the first metal gate and the second metal gate are vertically aligned and configured with an air gap disposed therebetween; and
wherein the first source/drain region and the second source/drain region are vertically aligned and configured with another air gap disposed therebetween.

18. The semiconductor structure of claim 17, further comprising:
an interlevel dielectric layer disposed over the second source/drain region;
one or more trenches disposed in the interlevel dielectric layer and configured to expose a top surface of the substrate; and
a dielectric layer disposed in at least a top portion of the one or more trenches, wherein the dielectric layer seals the air gaps positioned between the first metal gate and the second metal gate and between the first source/drain region and the second source/drain region.

19. The semiconductor structure of claim 18, further comprising:
a first metal contact configured to provide electrical contact with the first source/drain region; and
a second metal contact configured to provide electrical contact with the second source/drain region.

20. The semiconductor structure of claim 17, further comprising inner spacers disposed on sidewalls of the first metal gate and the second metal gate.

* * * * *